(12) United States Patent
Kimura et al.

(10) Patent No.: US 10,299,381 B2
(45) Date of Patent: May 21, 2019

(54) ELECTRONIC DEVICE AND SUBSTRATE

(71) Applicant: Toshiba Memory Corporation, Minato-ku (JP)

(72) Inventors: Naoki Kimura, Ebina (JP); Tatsuro Hiruta, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 227 days.

(21) Appl. No.: 15/057,497

(22) Filed: Mar. 1, 2016

(65) Prior Publication Data

US 2017/0064833 A1    Mar. 2, 2017

Related U.S. Application Data

(60) Provisional application No. 62/212,059, filed on Aug. 31, 2015.

(51) Int. Cl.
    *H05K 1/18*    (2006.01)
    *H05K 1/11*    (2006.01)
    *H05K 1/02*    (2006.01)

(52) U.S. Cl.
    CPC ........... *H05K 1/181* (2013.01); *H05K 1/0296* (2013.01); *H05K 1/111* (2013.01); *H05K 2201/10015* (2013.01); *H05K 2201/10522* (2013.01)

(58) Field of Classification Search
    USPC ........................................................ 361/767
    See application file for complete search history.

(56) References Cited

U.S. PATENT DOCUMENTS

| 8,446,176 B1 | 5/2013 | Yang et al. |
| 2007/0200217 A1* | 8/2007 | Tsukahara ........... H01L 23/5389 257/690 |

FOREIGN PATENT DOCUMENTS

| JP | 2001-196460 | 7/2001 |
| JP | 2004-165572 | 6/2004 |

\* cited by examiner

*Primary Examiner* — Andargie M Aychillhum
(74) *Attorney, Agent, or Firm* — Oblon, McClelland, Maier & Neustadt, L.L.P.

(57) ABSTRACT

According to one embodiment, an electronic device includes a substrate including a first face, a plurality of first conductors on the first face, a plurality of second conductors on the first face, and a first electronic component mounted on the first face, and including a first terminal connected to the plurality of first conductors, and a second terminal connected to the plurality of second conductors.

15 Claims, 14 Drawing Sheets

ELECTRONIC DEVICE AND SUBSTRATE

CROSS-REFERENCE TO RELATED APPLICATIONS

This application is based upon and claims the benefit of priority from U.S. Provisional Application No. 62/212,059, filed on Aug. 31, 2015; the entire contents of which are incorporated herein by reference.

FIELD

Embodiments described herein relate generally to an electronic device and a substrate.

BACKGROUND

An electronic device includes a substrate and an electronic component mounted to the substrate. For example, a circuit is formed on the substrate with the electronic component and a pattern. After the circuit is designed, the electronic component may be changed to another electronic component.

DETAILED DESCRIPTION

According to the present embodiment, an electronic device is provided, which includes a substrate including a first face; a plurality of first conductors on the first face; a plurality of second conductors on the first face; and a first electronic component mounted on the first face, and including a first terminal connected to the plurality of first conductors, and a second terminal connected to the plurality of second conductors.

Exemplary embodiments of an electronic device will be described below in detail with reference to the accompanying drawings. The present invention is not limited to the following embodiments.

(First Embodiment)

Hereinafter, a first embodiment will be described with reference to FIGS. 1 to 7. Note that a plurality of expressions may be written regarding configuration elements and description of the elements according to the embodiment. Providing other expressions that have not been written is not hindered regarding the configuration elements and the description. Further, providing other expressions is not hindered regarding configuration elements and description that have not been written in a plurality of expressions.

Figure 1:
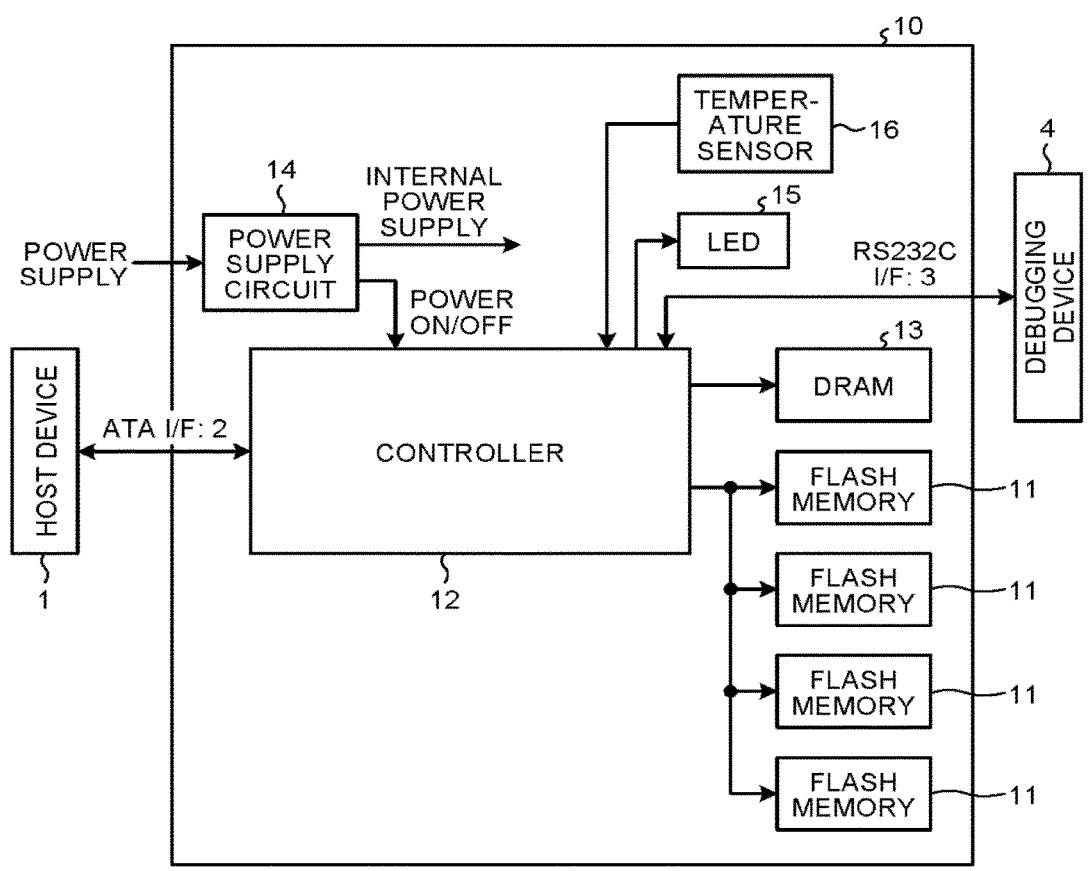
FIG. 1 is a block diagram illustrating a configuration example of an SSD according to a first embodiment.

FIG. 1 is a block diagram illustrating a configuration example of a solid state drive (SSD) 10 according to a first embodiment. The SSD 10 is an example of an electronic device, and may be called storage device, semiconductor storage device, device, or component, for example. Note that the electronic device is not limited to the SSD 10, and may be a personal computer, a tablet, a smart phone, a mobile phone, a television receiver, a display, or another device.

The SSD 10 is connected to a host device (hereinafter, referred to as host) 1 through a connection interface (I/F) 2. The SSD 10 is used as an external storage device of the host 1, for example. As the connection interface 2, a standard such as serial advanced technology attachment (SATA), peripheral component interconnect express (PCI Express, PCIe), universal serial bus (USE), or serial attached SCSI (SAS), etc. is applied.

The host 1 may be, for example, a server, a personal computer, a tablet, a smart phone, or a mobile phone, or may be an imaging device such as a still camera or a video camera. The host 1 is not limited to the aforementioned devices.

The SSD 10 can transmit/receive data to/from other devices such as a debugging device 4 through a communication interface 3 such as an RS232C interface (RS232C I/F).

The SSD 10 includes a plurality of flash memories 11, a controller 12, a dynamic random access memory (DRAM) 13, a power supply circuit 14, an LED 15, and a temperature sensor 16. The controller 12 is an example of a fourth electronic component.

The flash memory 11 is a NAND-type flash memory, for example. The flash memory 11 may be another flash memory. The DRAM 13 can perform a higher-speed storage operation than the flash memory 11. The LED 15 is used to display a state of the SSD 10. The temperature sensor 16 detects a temperature of an inside of the SSD 10.

The controller is a system-on-a-chip (SoC), for example. The controller 12 may be another integrated circuit (IC) or a circuit, for example. The controller 12 controls the flash memories 11, the DRAM 13, the power supply circuit 14, the LED 15, and the temperature sensor 16, for example.

The power supply circuit 14 generates a plurality of different internal DC power supply voltages from an external DC power supply supplied from a power supply circuit at a side of the host 1. The power supply circuit 14 supplies these internal DC power supply voltages to respective circuits in the SSD 10. The power supply circuit 14 detects rise of the external power supply, generates a power-on reset signal, and supplies the signal to the controller 12.

Figure 2:
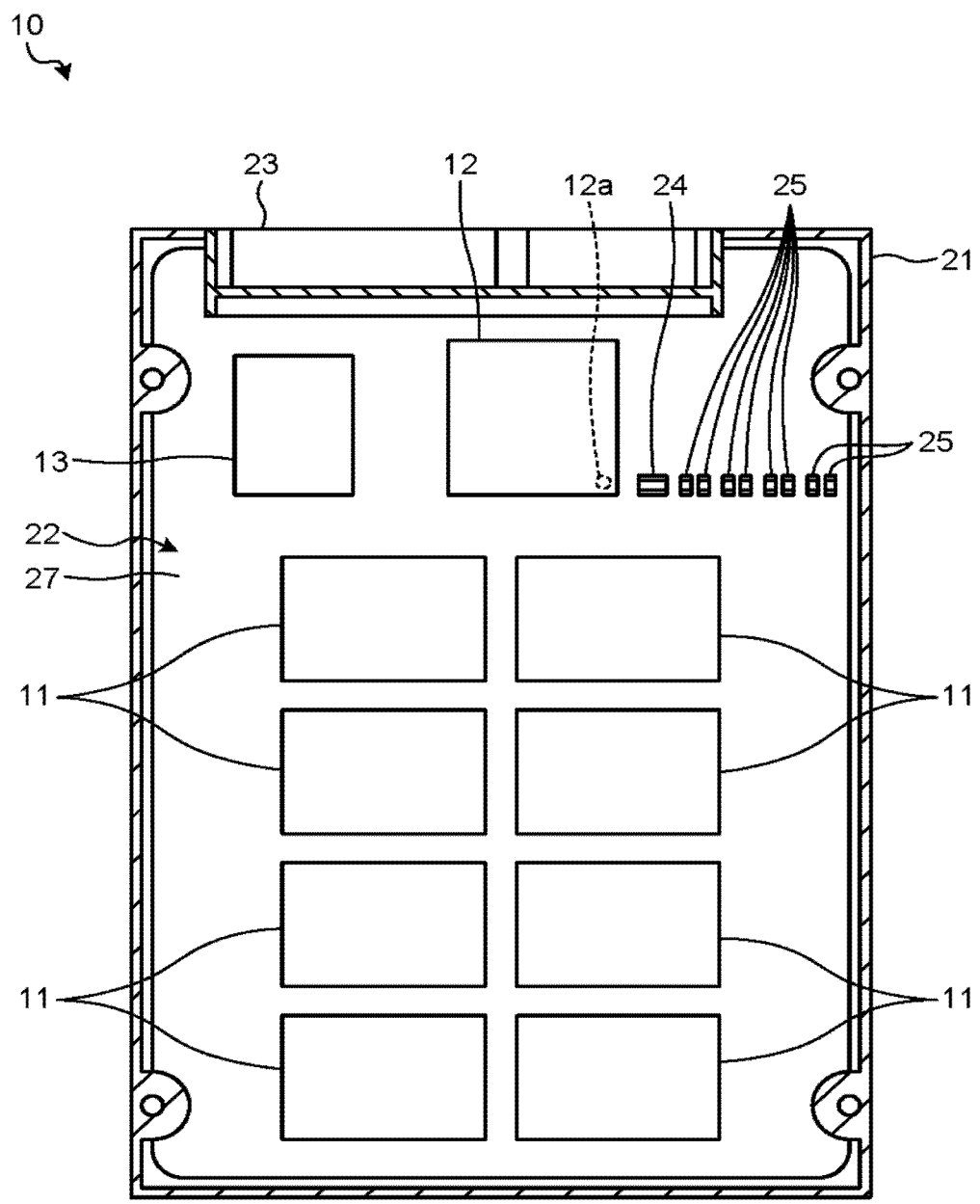
FIG. 2 is a plan view illustrating an inside of the SSD of the first embodiment.

FIG. 2 is a plan view illustrating the inside of the SSD 10 of the first embodiment. In other words, FIG. 2 is a plan view illustrating the SSD 10 except a part of a housing 21 of the SSD 10. As illustrated in the drawings, an X axis, a Y axis, and a Z axis are defined in the present specification. The X axis, the Y axis, and the Z axis are perpendicular to one another. The X axis runs along the width of the SSD 10. The Y axis runs along the length of the SSD 10. The Z axis runs along the thickness of the SSD 10.

As illustrated in FIG. 2, the SSD 10 further includes the housing 21, a substrate 22, a connector 23, a first capacitor 24, and a plurality of second capacitors 25 The first capacitor 24 is an example of a first electronic component and a stacked ceramic capacitor. Each of the second capacitors 25 is an example of a third electronic component, a fifth electronic component, and a sixth electronic component.

The housing 21 is made of metal or a synthetic resin, for example, and substantially formed into a rectangular parallelepiped box. The housing 21 includes, for example, two covers, or a frame and two covers. These frame and covers are fixed to one another with screws.

The substrate 22 is, for example, a printed circuit board (PCB). Note that the substrate 22 may be another substrate like a flexible printed circuit board (FPC). The substrate 22 is accommodated in the housing 21. The substrate 22 of the SSD 10 may be exposed, rather than accommodated in the housing 21.

Figure 3:
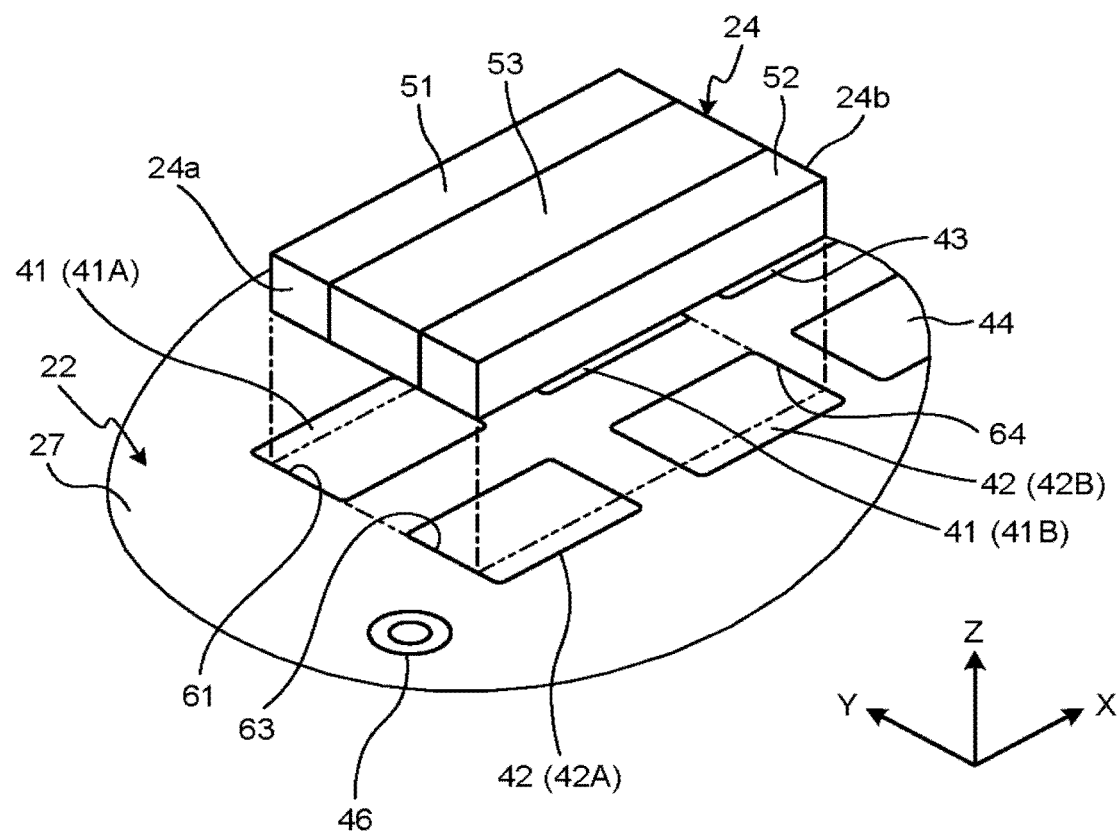
FIG. 3 is a perspective view illustrating a part of a substrate and a first capacitor of the first embodiment.
Figure 4:
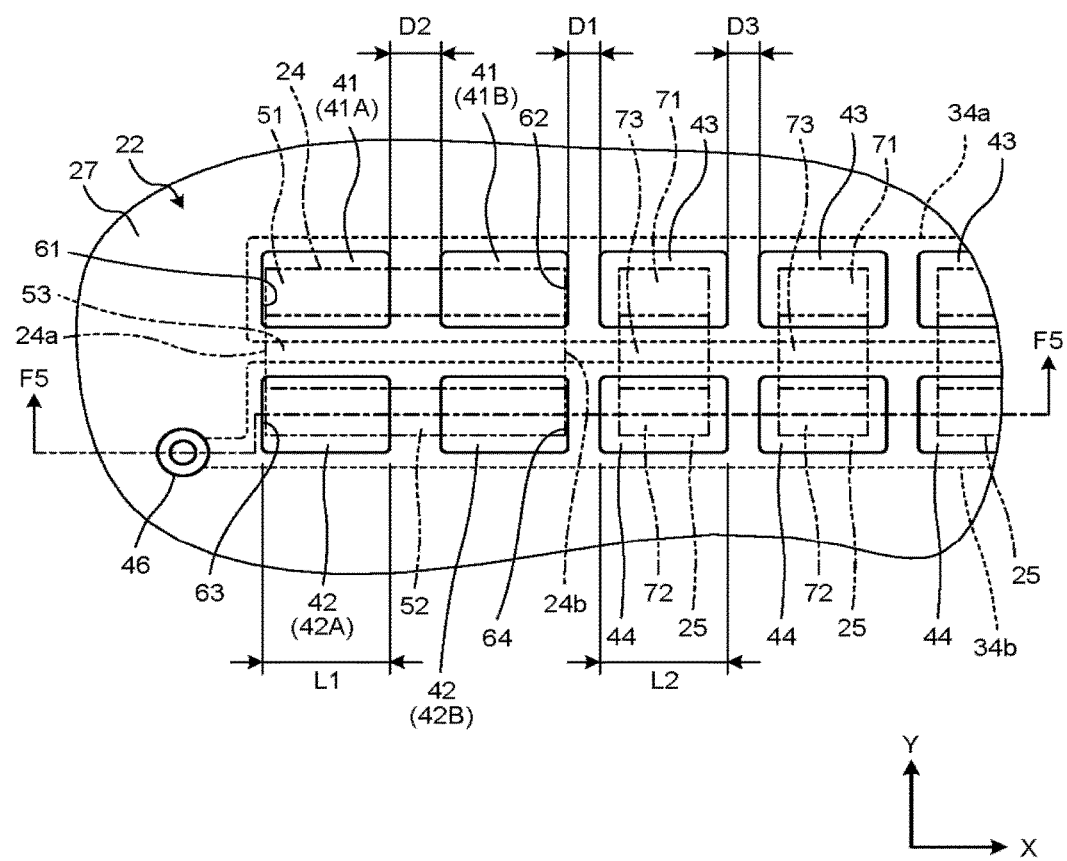
FIG. 4 is a plan view illustrating a part of the substrate and first and second capacitors of the first embodiment.
Figure 5:
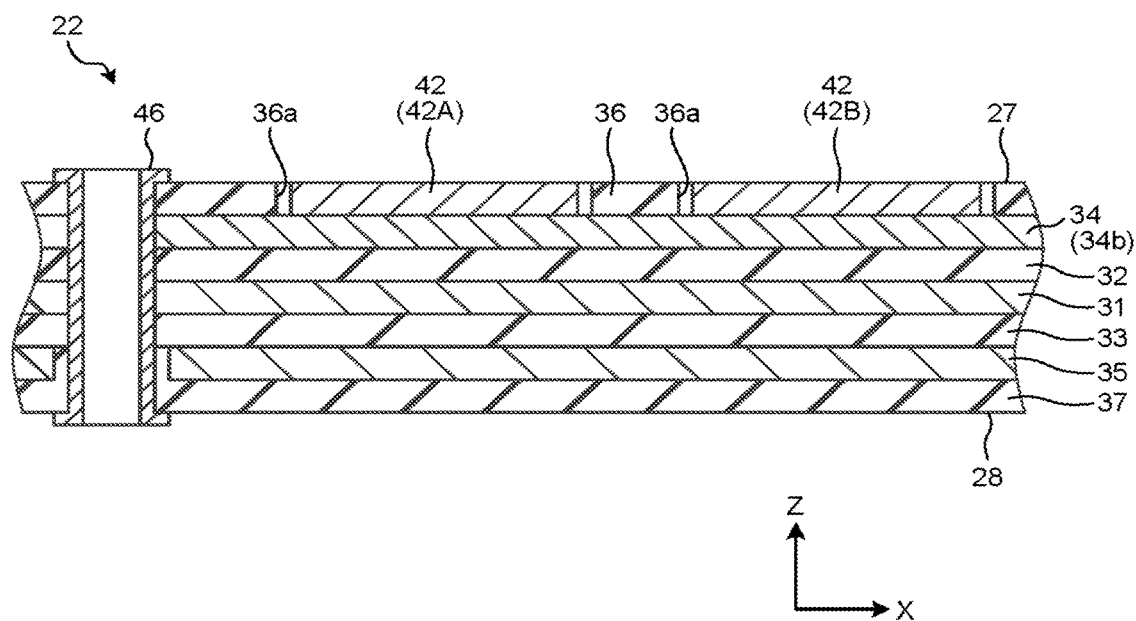
FIG. 5 is a sectional view illustrating a part of the substrate of the first embodiment.

FIG. 3 is a perspective view illustrating a part of the substrate 22 and the first capacitor 24 of the first embodiment. FIG. 4 is a plan view illustrating a part of the substrate 22 and the first and second capacitors 24 and 25 of the first embodiment. FIG. 5 is a sectional view illustrating a part of the substrate 22 of the first embodiment along the F5-F5 line of FIG. 4.

As illustrated in FIG. 5, the substrate 22 includes a first mounting face 27 and a second mounting face 28. The first mounting face 27 is an example of a first face. The second mounting face 28 is an example of a second face. Each of the first and second mounting surfaces 27 and 28 is substantially formed in a flat manner. The second mounting face 28 is positioned on an opposite side to the first mounting face 27.

The substrate 22 further includes a ground layer 31, a first insulating layer 32, a second insulating layer 33, a first conductive layer 34, a second conductive layer 35, a first cover layer 36, and a second cover layer 37. Each of the first and second conductive layers 34 and 35 can also be called conductor, for example. In the present embodiment, the ground layer 31 is an example of a ground layer. However, for example, the first or second conductive layer 34 or 35 may include the ground layer. Note that the substrate 22 may have a larger number of layers than the structure of FIG. 5, or may have a smaller number of layers than the structure of FIG. 5.

Each of the ground layer 31, the first conductive layer 34, and the second conductive layer 35 is made of, for example, metal such as a copper foil. Each of the first and second insulating layers 32 and 33 and the first and second cover layers 36 and 37 is made of, for example, an insulator such as a synthetic resin.

The first and second insulating layers 32 and 33 are formed on both surfaces of the ground layer 31. Therefore, the ground layer 31 is arranged between the first and second insulating layers 32 and 33.

The first conductive layer 34 is provided on the first insulating layer 32. The second conductive layer 35 is provided on the second insulating layer 33. Therefore, the ground layer 31, the first insulating layer 32, and the second insulating layer 33 are arranged between the first and second conductive layers 34 and 35.

The first conductive layer 34 includes first wiring 34a and second wiring 34b illustrated by the broken lines in FIG. 4. The first wiring 34a is an example of a first conductive portion. The second wiring 34b is an example of a second conductive portion.

The first and second wiring 34a and 34b form, for example, a part of the power supply circuit 14. The first and second wiring 34a and 34b are not limited thereto, and may form a part of another circuit. The first conductive layer 34 further includes a part of a circuit formed on the substrate 22, such as other wiring and land. The second conductive layer 35 also includes a part of a circuit formed on the substrate 22, such as wiring and a land.

In the present embodiment, each of the first wiring 34a and the second wiring 34b is extended in a direction along the X axis. The direction along the X axis is an example of a first direction. In other words, the first and second wiring 34a and 34b are substantially extended in parallel. The second wiring 34b is separated from the first wiring 34a in a direction along the Y axis. The direction along the Y axis is an example of a second direction. The first and second wiring 34a and 34b may be extended in another direction, or may be separated from each other in other directions.

As illustrated in FIG. 5, the first cover layer provided on the first conductive layer 34. The first cover layer 36 covers at least a part of the first conductive layer 34. The second cover layer 37 is provided on the second conductive layer 35. The second cover layer 37 covers at least a part of the second conductive layer 35. The ground layer 31, the first and second insulating layers 32 and 33, and the first and second conductive layers 34 and 35 are arranged between the first and second cover layers 36 and 37. The first cover layer 36 forms at least a part of the first mounting face 27. The second cover layer 37 forms at least a part of the second mounting face 28.

A plurality of openings 36a is provided in the first cover layer 36. The plurality of openings 36a expose parts of the first wiring 34a, and parts of the second wiring 34b. Each of the opening 36a substantially formed into a quadrilateral shape. The opening 36a may be formed into another shape.

As illustrated in FIG. 4, two first pads 41, two second pads 42, a plurality of third pads 43, and a plurality of fourth pads 44 are formed on the first mounting face 27. The first pads 41 are an example of first conductors. The second pads 42 are an example of second conductors. Each of the third pads 43 is each example of a fifth conductor, a seventh conductor, and a ninth conductor. Each of the fourth pads 44 is each example of a sixth conductor, an eighth conductor, and a tenth conductor. Each of the first to fourth pads 41 to 44 may be called a land, for example.

Three or more first pads 41 and/or three or more second pads 42 may be formed on the first mounting face 27. The number of the first pads 41 and the number of second pads 42 may be different.

The first and third pads 41 and 43 are made of metal such as nickel and gold, on parts of the first wiring 34a exposed through the openings 36a. The first wiring 34a is connected to the two first pads 41 and the plurality of third pads 43.

The two first pads 41 are arranged in the direction along the X axis with a space. In other words, the two first pads 41 are arranged in a direction into which the first wiring 34a is extended. Hereinafter, one of the first pads 41 may be called first pad 41A, and the other of the first pads 41 may be called first pad 41B.

The first pad 41A is an example of a first end conductor. The first pad 41B is an example of a second end conductor. The first pad 41A and the first pad 41B are adjacent to each other with a space in the direction along the X axis.

The plurality of third pads 43 is arranged in the direction along the X axis with a space. In other words, the plurality of third pads 43 is arranged in the direction into which the first wiring 34a is extended. One of the third pads 43 positioned in one end portion of the plurality of third pads 43, is adjacent to one first pad 41B with a space in the direction along the X axis.

The second and fourth pads 42 and 44 are made of metal such as nickel and gold, on parts of the second wiring 34b exposed through the openings 36a. The second wiring 34b is connected to the two second pads 42 and the plurality of fourth pads 44.

The two second pads 42 are arranged in the direction along the X axis with a space. In other words, the two second pads 42 are arranged in a direction into which the second wiring 34b is extended. Hereinafter, one of the second pads 42 may be called second pad 42A, and the other of the second pads 42 may be called second pad 42B.

The second pad 42A is an example of a third end conductor. The second pad 42B is an example of a fourth end conductor. The second pad 42A and the second pad 42B are adjacent to each other with a space in the direction along the X axis.

The second pad 42A is adjacent to the first pad 41A with a space in the direction along the Y axis. The second pad 42B is adjacent to the first pad 41B with a space in the direction along the Y axis.

The plurality of fourth pads 44 is arranged in the direction along the X axis with a space. In other words, the plurality of fourth pad 44 is arranged in the direction into which the second wiring 34b is extended. One of the fourth pads 44 positioned in one end portion of the plurality of fourth pads 44, is adjacent to one second pad 42B with a space in the direction along the X axis. The fourth pads 44 are respectively adjacent to corresponding third pads 43 with a space in the direction along the Y axis.

Each of the first to fourth pads 41 to 44 is substantially formed into a quadrilateral shape. Each of the first to fourth pads 41 to 44 may be formed into another shape. Each of the first to fourth pads 41 to 44 is smaller than the opening 36a.

In the direction along the X axis, a distance D1 between the first pad 41B and the third pad 43 adjacent to the first pad 41B is shorter than a distance D2 between the two first pads 41. Similarly, in the direction along the X axis, a distance between the second pad 42B and the fourth pad 44 adjacent to the second pad 42B is shorter than a distance between the two second pads 42. The distance D1 is, for example, about 0.25 mm. The distance D2 is, for example, about 0.30 mm. The distances D1 and D2 are not limited to the examples.

In the direction along the X axis, the distance D1 between the first pad 41B and the third pad 43 adjacent to the first pad 41B is substantially equal to a distance 63 between the adjacent third pads 43. The distance D3 is, for example, about 0.25 mm. The distance D3 is not limited to the example. Similarly, in the direction along the X axis, a distance between the second pad 42B and the fourth pad 44 adjacent to the second pad 42B is substantially equal to a distance between the adjacent fourth pads 44.

In the direction along the X axis, a length L1 of each of the second pad 42 is substantially equal to length L2 of each of the fourth pad 44. Similarly, in the direction along the X axis, a length of each of the first pad 41 is substantially equal to a length of each of the third pad 43. Each of the lengths L1 and L2 is, for example, about 0.35 mm. The lengths L1 and L2 are not limited to the example.

As illustrated in FIG. 5, a via 46 is provided in the substrate 22. The via 46 connects the second wiring 34b and the ground layer 31. Therefore, the second wiring 34b connects each of the second and fourth pads 42 and 44, and the ground layer 31.

As illustrated in FIG. 2, the flash memories 11, the controller 12, and the DRAM 13 are mounted on the first mounting face 27 of the substrate 22. At least one of the flash memories 11, the controller 12, and the DRAM 13 may be mounted on another place or the substrate 22. For example, some of the flash memories 11 may be mounted on the second mounting face 28.

The controller 12 includes a plurality of terminals, the terminals including a power supply terminal 12a illustrated by the broken line in FIG. 2. The power supply terminal 12a is soldered to a pad connected to the first wiring 34a. Therefore, the first wiring 34a connects each of the first and third pads 41 and 43, and the power supply terminal 12a. Each of potentials of the first and third pads 41 and 43 is substantially equal to a potential of the power supply terminal 12a. Various components may be provided in an electrical path between the first and third pads 41 and 43, and the controller 12. The controller 12 is supplied with an internal DC power supply voltage from the power supply circuit 14 of FIG. 1, through the power supply terminal 12a.

The first pads 41 illustrated in FIG. 4 are closer to the power supply terminal 12a than the third pads 43. Similarly, the second pads 42 are closer to the power supply terminal 12a than the fourth pads 44. Further, the first pad 41A is closer to the power supply terminal 12a than the first pad 41B. Similarly, the second pad 42A is closer to the power supply terminal 12a than the second pad 42B.

As illustrated in FIG. 2, the connector 23 is mounted on one end portion of the substrate 22 in the direction along the Y axis. The connector 23 includes at least part of the connection I/F 2 and the power supply circuit 14. The controller 12 is positioned between the connector 23, and the plurality of flash memories 11.

Each of the first and second capacitors 24 and 25 illustrated by two-dot chain lines in FIG. 4 is a stacked ceramic capacitor (MLCC). Each of the first and second capacitors 24 and 25 may be other capacitor.

The first capacitor 24 includes a first terminal portion 51, a second terminal portion 52, and an electricity storage portion 53. The first terminal portion 51 is an example of a first terminal. The second terminal portion 52 is an example of a second terminal. Each of the first and second terminal portions 51 and 52 can be called electrode, for example. The first terminal portion 51 is provided in one end portion of the first capacitor 24 in the direction along the Y axis. The second terminal portion 52 is provided in the other end portion of the first capacitor 24 in the direction along the Y axis. Each of the first and second terminal portions 51 and 52 is extended in the direction along the X axis. The electricity storage portion 53 includes a plurality of internal electrodes and a dielectric lying between the internal electrodes. The electricity storage portion 53 is positioned between the first terminal portion 51 and the second terminal portion 52.

The length (width) of the first capacitor 24 in the direction along the X axis is longer than the length of the first capacitor 24 in the direction along the Y axis. Such a first capacitor 24 may be called LW reversed type capacitor. The length of the first capacitor 24 in the direction along the X axis is, for example, about 1.00 mm. The length of the first capacitor 24 in the direction along the Y axis is, for example, about 0.50 mm. The lengths of the first capacitor 24 in the directions along the X axis and the Y axis are not limited to these examples.

The first terminal portion 51 extended in the direction along the X axis is arranged on the two first pads 41. The first terminal portion 51 is soldered to the two first pads 41. In other words, one first terminal portion 51 is connected to each of the two first pads 41.

The second terminal portion 52 extended in the direction along the X axis is arranged on the two second pads 42. The second terminal portion 52 is soldered to the two second pads 42. In other words, one second terminal portion 52 is connected to each of the two second pads 42.

The first terminal portion 51 is soldered to the first pads 41, and the second terminal portion 52 is soldered to the second pads 42, so that the first capacitor 24 is mounted on the first mounting face 27. The first terminal portion 51 is connected to the first wiring 34a through the first pads 41. The second terminal portion 52 is connected to the second wiring 34b through the second pads 42. Therefore, the first capacitor 24 intermediates between the first wiring 34a and the second wiring 34b.

The first capacitor 24 includes a first end portion 24a and a second end portion 24b in the direction along the X axis. The second end portion 24b is positioned at an opposite side to the first end portion 24a. The first end portion 24a is closer to the power supply terminal 12a of the controller 12 than the second end portion 24b.

The first pad 41A includes a first edge 61. The first edge 61 can also be called side or end portion. The first edge 61 is one end portion of the substantially quadrilateral first pad 41A in the direction along the X axis. The first edge 61 is closer to the power supply terminal 12a of the controller 12 than the other end portion of the first pad 41A in the direction along the X axis. Further, the first edge 61 is farther from the first pad 41B than the other end portion in the direction along the X axis. The first edge 61 is extended in the direction along the Y axis.

The first pad 41B includes a second edge 62. The second edge 62 can also be called side or end portion. The second edge 62 is one end portion of the substantially quadrilateral first pad 41B in the direction along the X axis. The second edge 62 is farther from the power supply terminal 12a of the controller 12 than the other end portion of the first pad 41B in the direction along the X axis. Further, the second edge 62 is farther from the first pad 41A than the other end portion in the direction along the X axis. The second edge 62 is extended in the direction along the Y axis.

The first edge 61 is slightly separated from the first capacitor 24 in the direction along the X axis, in plan view of the first mounting face 27 illustrated in FIG. 4. The first edge 61 may be substantially superimposed on the first end portion 24a of the first capacitor 24 in the direction along the X axis.

The second edge 62 is slightly separated from the first capacitor 24 in the direction along the X axis, in plan view of the first mounting face 27. The second edge 62 may be substantially superimposed on the second end portion 24b of the first capacitor 24 in the direction along the X axis.

The second pad 42A includes a third edge 63 The third edge 63 can also be called side or end portion. The third edge 63 is one end portion of the substantially quadrilateral second pad 42A in the direction along the X axis. The third edge 63 is closer to the power supply terminal 12a of the controller 12 than the other end portion of the second pad 42A in the direction along the X axis. The third edge 63 is farther from the second pad 42B than the other end portion in the direction along the X axis. The third edge 63 is extended in the direction along the Y axis.

The second pad 42B includes a fourth edge 64. The fourth edge 64 can also be called side or end portion, for example. The fourth edge 64 is one end portion of the substantially quadrilateral second pad 42B in the direction along the X axis. The fourth edge 64 is farther from the power supply terminal 12a of the controller 12 than the other end portion of the second pad 42B in the direction along the X axis. Further, the fourth edge 64 is farther from the second pad 42A than the other end portion in the direction along the X axis. The fourth edge 64 is extended in the direction along the Y axis.

The third edge 63 is slightly separated from the first capacitor 24 in the direction along the X axis, in plan view of the first mounting face 27. The third edge 63 may be substantially superimposed on the first end portion 24a of the first capacitor 24 in the direction along the X axis.

The fourth edge 64 is slightly separated from the first capacitor 24 in the direction along the X axis, in plan view of the first mounting face 27. The fourth edge 64 may be substantially superimposed on the second end portion 24b of the first capacitor 24, in the direction along the X axis.

The distance between the first edge 61 and the second edge 62 is slightly longer than the length between the first end portion 24a and the second end portion 24b of the first capacitor 24 in the direction along the X axis. Further, the distance between the first edge 61 and the second edge 62 is substantially equal to or longer than the recommended length of a pad for the first capacitor 24 in the direction along the X axis.

The distance between the third edge 63 and the fourth edge 64 is longer than the length between the fir end portion 24a and the second end portion 24b of the first capacitor 24 in the direction along the X axis. Further, the distance between the third edge 63 and the fourth edge 64 is substantially equal to or longer than the recommended length of a pad for the first capacitor 24 in the direction along the X axis.

Each of the plurality of second capacitors 25 includes a third terminal portion 71, a fourth terminal portion 72, and an electricity storage portion 73. The third terminal portion 71 is an example of a fifth terminal, a seventh terminal, and a ninth terminal. The fourth terminal portion 72 is an example of a sixth terminal, an eighth terminal, and a tenth terminal. Each of the third and fourth terminal portions 71 and 72 can also be called electrode, for example.

The third terminal portion 71 is provided in one end portion of the second capacitor 25 in the direction along the Y axis. The fourth terminal portion 72 is provided in the other end portion of the second capacitor 25 in the direction along the Y axis. Each of the third, and fourth terminal portions 71 and 72 is extended in the direction along the X axis. The electricity storage portion 73 includes a plurality of internal electrodes and a dielectric lying between the internal electrodes. The electricity storage portion 73 is positioned between the third terminal portion 71 and the fourth terminal portion 72.

The length (width) of each of the second capacitors 25 in the direction along the X axis is shorter than the length of each of the second capacitors 25 in the direction along the Y. In other words, each of the second capacitors 25 extends in the direction along the Y axis.

The length of each of the second capacitors 25 in the direction along the Y axis is slightly longer than the length of the first capacitor 24 in the direction along the Y axis.

Note that the length of each of the second capacitors 25 in the direction along the Y axis may be substantially equal to the length of the first capacitor 24 in the direction along the Y axis. The length (width) of each of the second capacitors 25 in the direction along the X axis is shorter than the length (width) of the first capacitor 24 in the direction along the X axis. The length of each of the second capacitors 25 in the direction along the X axis is, for example, about 0.3 mm. The length of each of the second capacitors 25 in the direction along the axis is, for example, about 0.6 mm. The lengths of each of the second capacitors 25 in the directions along the X axis and the Y axis are not limited to the examples.

The third terminal portions 71 are respectively soldered to corresponding third pads 43. In other words, one third terminal portion 71 is connected to one third pad 43. The fourth terminal portions 72 are respectively soldered to corresponding fourth pads 44. In other words, one fourth terminal portion 72 is connected to one fourth pad 44.

The third terminal portions 71 are soldered to the third pads 43, and the fourth terminal portions 72 are soldered to the fourth pads 44, so that the second capacitors 25 are mounted on the first mounting face 27. The third terminal portions 71 are connected to the first wiring 34a through the third pads 43. The fourth terminal portions 72 are connected to the second wiring 34b through the fourth pads 44. Therefore, the plurality of second capacitors 25 intermediates between the first wiring 34a and the second wiring 34b.

Typically, an equivalent s inductance (ESL) of a stacked ceramic capacitor tends to be increased according to a distance in which a current flows, and t be decreased as the width is increased. Therefore, the ESL of the first capacitor 24 is lower than the ESL of the second capacitor 25. For example, the ESL of the first capacitor 24 is ⅓ the ESL of the second capacitor 25. The ESL of the first capacitor 24 is not limited to the example.

Further, capacitance of the stacked ceramic capacitor tends to be decreased according to the distance in which the current flows, and to be increased as the width is increased. Therefore, the capacitance of the first capacitor 24 is larger than the capacitance of the second capacitor 25. Note that the capacitance of the first capacitor 24 is not limited to the example.

As described above, the first capacitor 24 is connected to the first and second pads 41 and 42, and the plurality of second capacitors 25 is connected to the third and fourth pads 43 and 44. Accordingly, the first capacitor 24 and the plurality of second capacitors 25 connect the first wiring 34a and the second wiring 34b in parallel. The first capacitor 24 is closer to the power supply terminal 12a of the controller 12 than the second capacitors 25.

Figure 6:
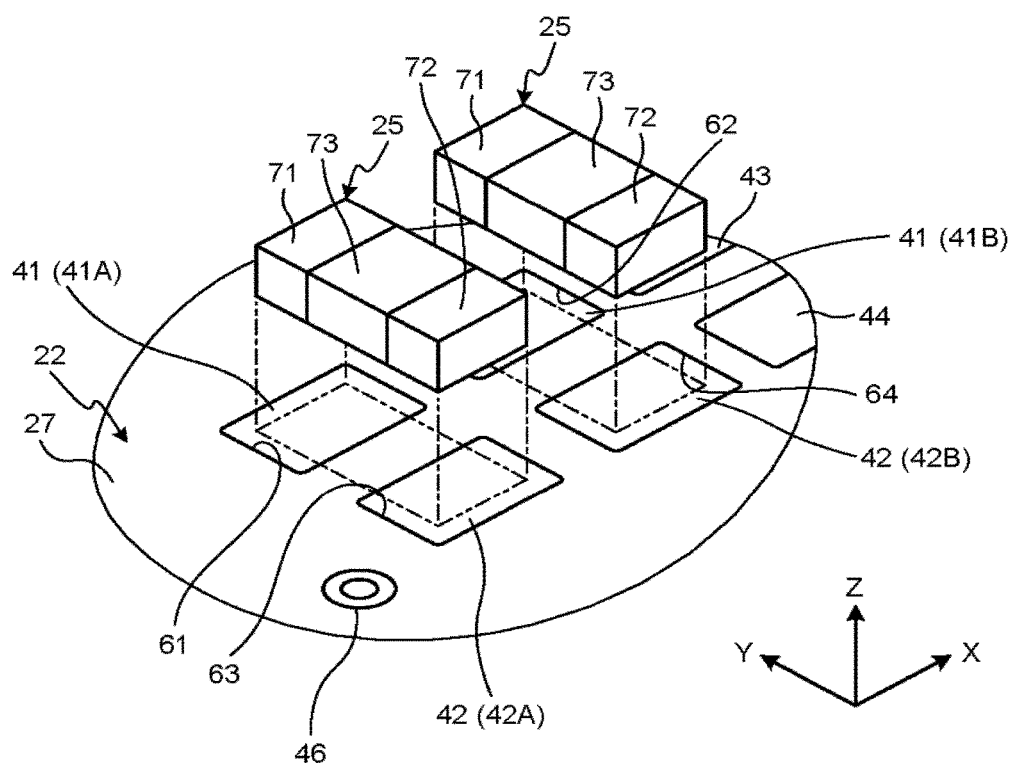
FIG. 6 is a perspective view illustrating a part of a substrate and second capacitors of a modification of the first embodiment.
Figure 7:
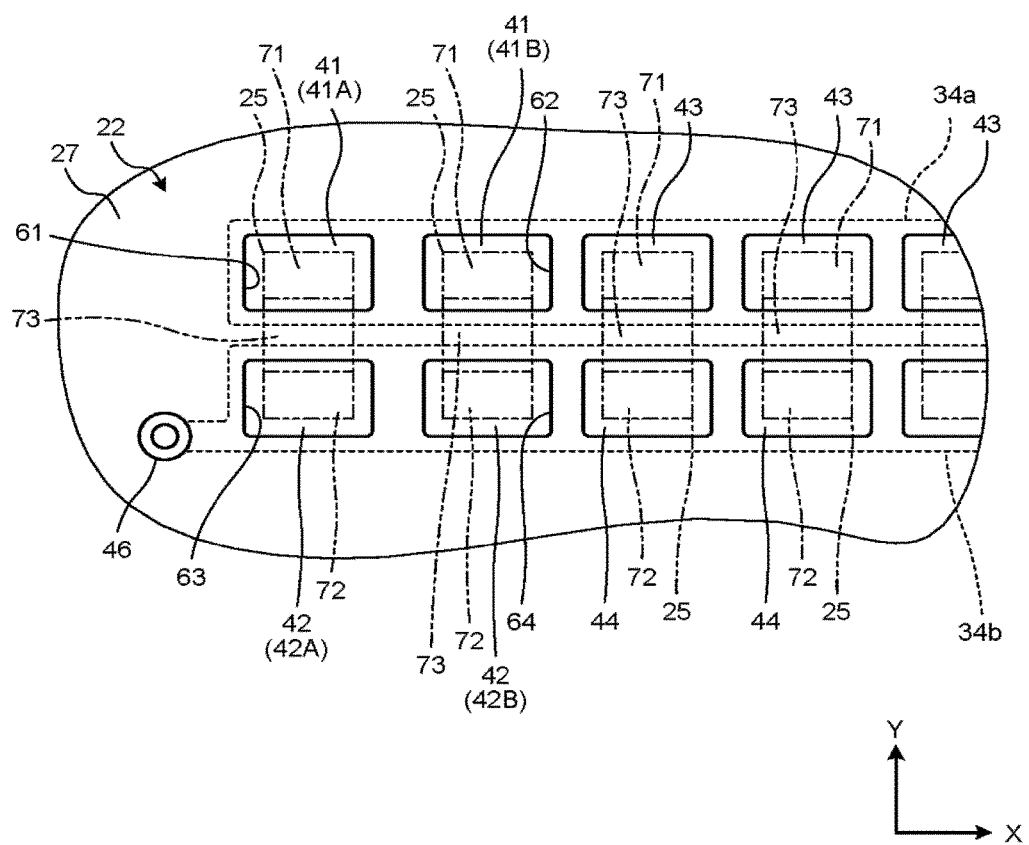
FIG. 7 is a plan view illustrating a part of the substrate and the second capacitors of the modification of the first embodiment.

FIG. 6 is a perspective view illustrating a part of a substrate 22 and second capacitors 25 of a modification of the first embodiment. FIG. 7 is a plan view illustrating a part of the substrate 22 and the second capacitors 25 of the modification of the first embodiment. Hereinafter, the modification of the SSD 10 of the first embodiment will be described with reference to FIGS. 6 and 7. The substrate 22 of the modification is the same as the substrate 22 of the first embodiment.

As illustrated in FIG. 6, in the modification of the first embodiment, two second capacitor 25 are connected to two first pads 41 and two second pads 42. In other words, the two second capacitors 25 are connected to the two first pads 41 and the two second pads 42, in place of the first capacitor 24.

In this case, third terminal portions 71 of the second capacitors 25 are respectively soldered to corresponding first pads 41. In other words, one third terminal portion 71 is connected to one first pad 41. Fourth terminal portions 72 are respectively soldered to corresponding second pads 42. In other words, one fourth terminal portion 72 is soldered to one second pad 42.

As described above, the two second capacitors 25 are connected to the first and second pads 41 and 42, and the plurality of second capacitors 25 is connected to third and fourth pads 43 and 44. Accordingly, the plurality of second capacitors 25 connects first wiring 34a and second wiring 34b in parallel. The distance between the two second capacitors 25 connected to the first and second pads 41 and 42 is longer than the distance between the two adjacent second capacitors 25 connected to the third and fourth pads 43 and 44 in the direction along the X axis.

The ESL of the first capacitor 24 is lower than that of each of the second capacitors 25. Therefore, a sum of the ESLs of the first capacitor 24 and the plurality of second capacitors 25 of the first embodiment is lower than a sum of the ESLs of the plurality of second capacitors 25 of the modification of the first embodiment.

The capacitance of the first capacitor 24 is larger than that of each of the second capacitors 25. Therefore, a sum of the capacitance of the first capacitor 24 and the plurality of second capacitors 25 of the first embodiment is larger than a sum of the capacitance of the plurality of second capacitors 25 of the modification of the first embodiment.

As described in the first embodiment and the modification of the first embodiment, the one first capacitor 24 or the two second capacitors 25 can be selectively connected to the two first pads 41 and the two second pads 42. Note that other capacitor or capacitors different from the first and second capacitors 24 and 25 may be connectable to the two first pads 41 and the two second pads 42.

In the above description, a set of the two first pads 41 and the two second pads 42 is provided on the substrate 22. However, a plurality of sets of the two first pads 41 and the two second pads 42 may be provided on the substrate 22. In this case, the first capacitor 24 may be connected to at least one set of the two first pads 41 and the two second pads 42, and the second capacitors 25 may be connected to the remaining sets of the two first pads 41 and the two second pads 42.

In the SSD 10 according to the first embodiment, the first terminal portion 51 of the first capacitor 24 is connected to the plurality of first pads 41, and the second terminal portion 52 is connected to the plurality of second pads 42. According to such an SSD 10, in value analyze (VA), for example, two second capacitors 25 respectively connected to one first pad 41 and one second pad 42 can be mounted on the first mounting face 27, for example, in place of the first capacitor 24. In this way, the first capacitor 24 can be changed to the second capacitors 25 to change performance of the SSD 10 (for example, the ESL and the capacitance) and a cost, without design change of the substrate 22. Therefore, for example, change of the performance and the cost of the SSD 10 is easier than a case where one special pad connected to the first terminal portion 51 and one special pad connected to the second terminal portion 52 are formed on the first mounting face 27. Further, a mounting area of the first mounting face 27 can be decreased, compared with a case where the performance and the cost of the SSD 10 is changed by addition of the second capacitors 25.

Typically, the ESL of the stacked ceramic capacitor tends to be increased according to the distance in which a current flows, and to be decreased as the width is increased. In the present embodiment, the length of the first capacitor 24 in the direction along the X axis is longer than the length of the first capacitor 24 in the direction along the Y axis. That is, the first capacitor 24 is so-called the LW reversed type capacitor, and has a lower ESL than that of a typical capacitor. Therefore, when the first capacitor 24 is mounted on the first mounting face 27, a radio frequency noise due to variation of the voltage of the power supply circuit 14 can be suppressed.

The first wiring 34a is connected to the plurality of first pads 41, and the second wiring 34b is connected to the plurality of second pads 42. According to such an SSD 10, a plurality of second capacitors 25 respectively connected to one first pad 41 and one second pad 42 can be mounted on the first mounting face 27 in parallel, in place of the first capacitor 24, for example. In other words, the first capacitor 24 can be connected to the plurality of first and second pads 41 and 42, and the second capacitors 25 can be respectively connected to the plurality of first and second pads 41 and 42. For example, when the first capacitor 24 is more expensive than the smaller second capacitor 25, one of mounting of the first capacitor 24 and mounting of the smaller second capacitors 25 in parallel, which is more adaptable to a condition, can be selected in design of the SSD 10.

The first and third edges 61 and 63 of the first and second pads 41A and 42A are separated from the first capacitor 24 in the direction along the X axis. Similarly, the second and fourth edges 62 and 64 of the first and second pads 41B and 42B are separated from the first capacitor 24 in the direction along the X axis. Therefore, each of the first and second pads 41 and 42 can be made larger than a case where the first to fourth edges 61 to 64 are superimposed on the first capacitor 24. Therefore, an amount of soldering in a connection portion between the first pads 41 and the first terminal portion 51, and in a connection portion between the second pads 42 and the second terminal portion 52 becomes large, the first capacitor can be more firmly fixed to the first and second pads 41 and 42.

Further, for example, if the first to fourth edges 61 to 64 are superimposed on the first capacitor 24, the second end portion 24b of the first capacitor 24 gets closer to the third and fourth pads 43 and 44 adjacent to the first and second pads 41B and 42B than to the second and fourth edges 62 and 64 of the first and second pads 41B and 42B. Therefore, in mounting the first capacitor 24 on the first and second pads 41 and 42, or in mounting the second capacitors 25 on the third and fourth pads 43 and 44, a surface mounting machine (mounter) that carries the first or second capacitor 24 or 25 may come in contact with the first or second capacitor 24 or 25 that has already been mounted. In contrast, in the present embodiment, the second and fourth edges 62 and 64 of the first and second pads 41B and 42B are separated from the first capacitor 24 in the direction along the X axis. Therefore, contact of the mounter to the fir t or second capacitor 24 or 25 can be suppressed.

The distance D1 between the first pad 41 and the third pad 43 in the direction along the X axis is narrower than the distance D2 between the plurality of adjacent first pads 41 in the direction along the X axis. That the distance D2 between the first pads 41 to which the first capacitor 24 or the second capacitor 25 can be connected is designed to be wider than the distance D1 between the third pad 43 to which the second capacitor 25 is connected and the first pad 41 to which the first capacitor 24 is connected. Accordingly, protrusion of the first capacitor 24 from the first and second pads 41 and 42 can be suppressed in the direction along the X axis, compared with a care where the distance D1 between the first pad 41 and the third pad 43 is equal to the distance D2 between the plurality of adjacent first pads 41. Therefore, contact of the mounter to the first or second capacitor 24 or 25 can be suppressed.

Each of the first and second pads 41 and 42 is closer to the power supply terminal 12a than the third and fourth pads 43 and 44. Accordingly, the noise of the controller 12 passes through the first capacitor 24 and escapes to the ground layer 31 in a shorter path, and it is suppressed that the first wiring 34a functions as an inductor. Therefore, the first capacitor 24 can more efficiently decrease variation of the power supply voltage.

(Second Embodiment)

Hereinafter, a second embodiment will be described with reference to FIG. 8. Note that, in description of a plurality of embodiments below, a configuration element having a similar function to the already described configuration element is denoted with the same reference sign of the already described configuration element, and description may be omitted. Further, not all of functions and characteristics are common in a plurality of configuration elements denoted with the same reference sign, and the plurality of configuration elements may have different functions and characteristics according to respective embodiments.

Figure 8:
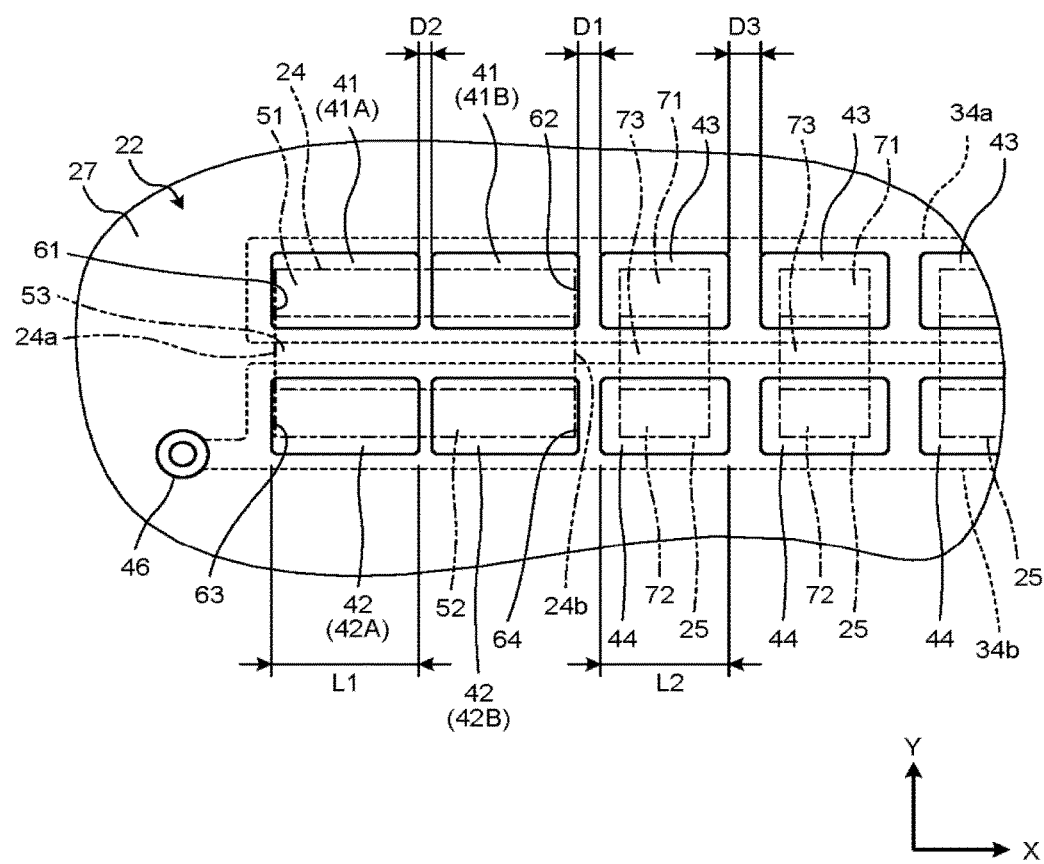
FIG. 8 is a plan view illustrating a part of a substrate and first and second capacitors according to a second embodiment.

FIG. 8 is a plan view illustrating a part of a substrate 22, and first and second capacitors 24 and 25 according to the second embodiment. As illustrated in FIG. 8, in the second embodiment, a distance D1 between a first pad 41B, and a third pad 43 adjacent to the first pad 41B in a direction along an X axis is longer than a distance D2 between two first pads 41. The distance D1 is, for example, about 0.225 mm. The distance D2 is, for example, about 0.10 mm. The distances D1 and D2 are not limited to these examples.

In the second embodiment, the distance D1 between the first pad 41B, and the third pad 43 adjacent to the first pad 41B in the direction along the X axis is shorter than a distance D3 between adjacent third pads 43. The distance D3 is, for example, about 0.25 mm. The distance D3 is not limited to the example.

In the second embodiment, a length L1 of each of second pads 42 is longer than a length L2 of each of fourth pads 44, in the direction along the X axis. The length L1 is, for example, about 0.45 mm. The length L2 is, for example, about 0.35 mm. The lengths L1 and L2 are not limited to the examples.

In an SSD 10 according to the second embodiment, the distance D1 between the first pad 41B and the third pad 43 in the direction along the X axis is wider than the distance D2 between the mutually adjacent first pads 41 in the direction along the X axis. That is, the distance D2 between the first pads 41 to which the first and second capacitors 24 and 25 can be respectively connected is designed to be narrower than the distance D1 between the third pad 43 to which the second capacitor 25 is connected and the first pad 41B to which the first capacitor 24 is connected. Accordingly, the first pads 41 can be made larger than a case where the distance D1 between the first pad 41B and the third pad 43 is equal to the distance 52 between the adjacent first pads 41. Therefore, an amount of soldering in a connection portion between the first pads 41 and a first terminal portion 51 becomes large, and the first capacitor 24 can be more firmly fixed to the first pads 41.

(Third Embodiment)

Figure 9:
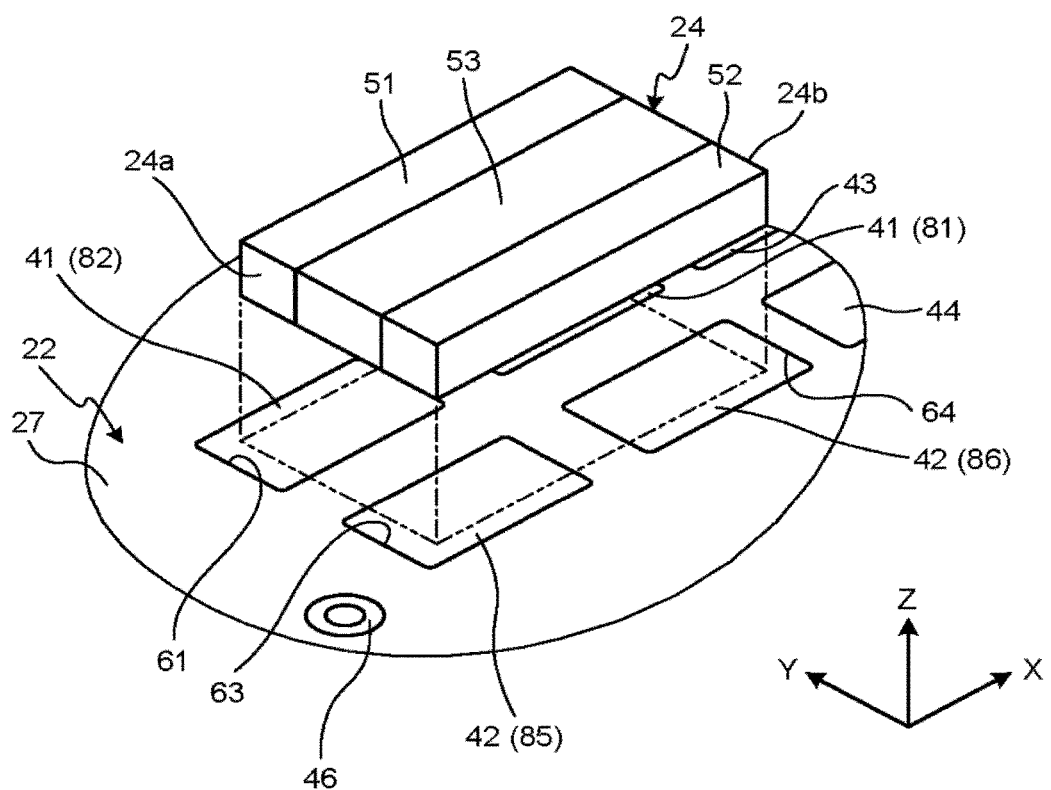
FIG. 9 is a perspective view illustrating a part of a substrate and a first capacitor according to a third embodiment.
Figure 10:
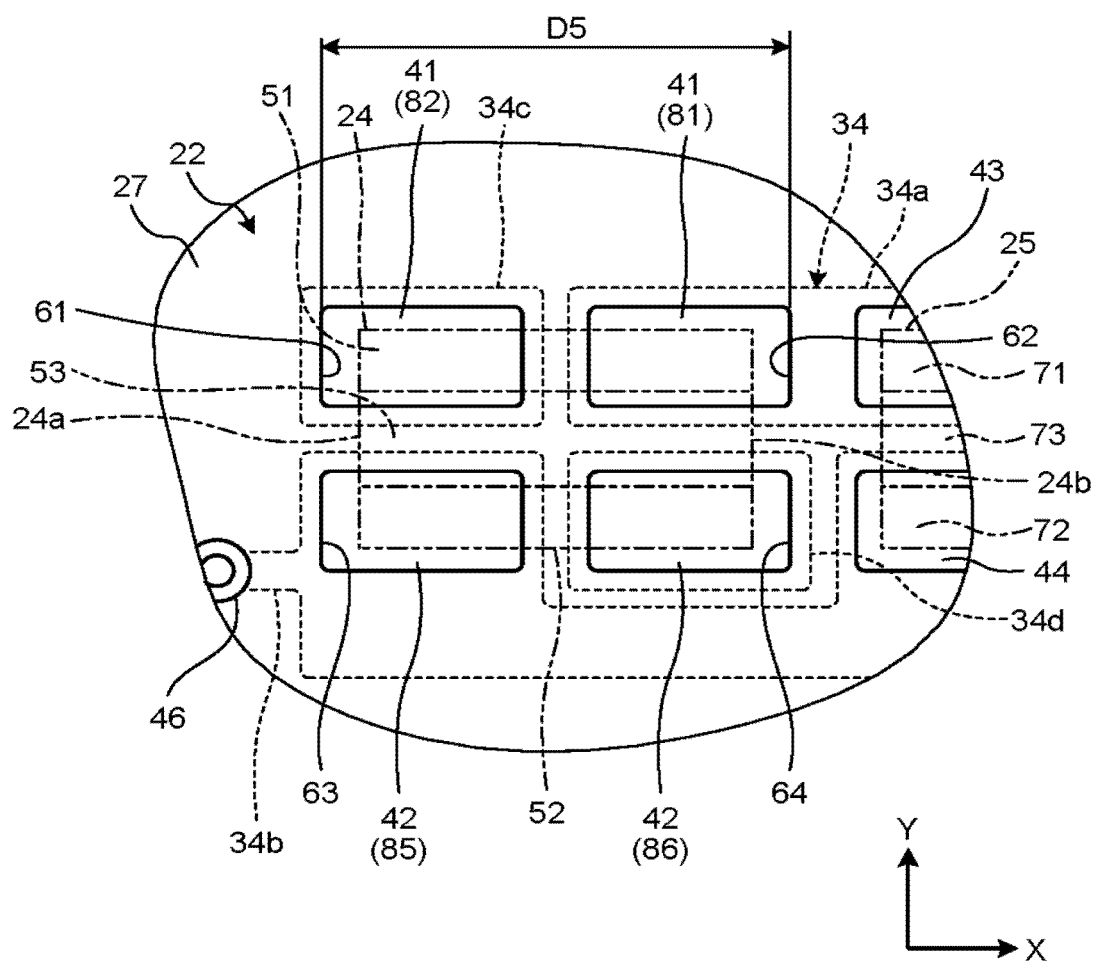
FIG. 10 is a plan view illustrating a part of the substrate and the first capacitors of the third embodiment.

Hereinafter, a third embodiment will be described with reference to FIGS. 9 to 13. FIG. 9 is a perspective view illustrating a part of a substrate 22 and a first capacitor 24 according to the third embodiment. FIG. 10 is a plan view illustrating a part of the substrate 22 and the first capacitor 24 of the third embodiment.

As illustrated in FIG. 10, a first conductive layer 34 of the third embodiment includes a first pattern 34c and a second pattern 34d. The first pattern 34c is electrically separated from and independent of a circuit of the substrate 22, the circuit including first and second wiring 34a and 34b. Similarly, the second pattern 34d is electrically separated from and independent of the circuit of the substrate 22 that includes the first and second wiring 34a and 34b.

The first pads 41 of the third embodiment include a first connecting pad 81 and a first fixing pad 82. The first connecting pad 81 is an example of a first connecting conductor. The first fixing pad 82 is an example of a first fixing conductor. In the present embodiment, the first connecting pad 81 is provided to electrically connect the first capacitor 24 to the first wiring 34a. In the present embodiment, the first fixing pad 82 is provided to fix the first capacitor 24 to a predetermined position. Note that the first connecting pad 81 and the first fixing pad 82 may have other purposes and/or other functions, respectively.

The first connecting pad 81 and the first fixing pad 82 are arranged with a space in a direction along an X axis. The firs connecting pad 81 includes a second edge 62. The first fixing pad 82 includes a first edge 61.

The first connecting pad 81 is connected to the first wiring 34a. The first fixing pad 82 is connected to the first pattern 34c. Therefore, the first fixing pad 82 is electrically separated from and independent of the circuit of the substrate 22 that includes the first and second wiring 34a and 34b. In other words, the first fixing pad 82 is not connected to the fir connecting pad 81.

Second pads 42 of the third embodiment include a second connecting pad 85 and a second fixing pad 86. The second connecting pad 85 is an example of a second connecting conductor. The second fixing pad 86 is an example of the second fixing conductor. In the present embodiment, the second connecting pad 85 is provided to electrically connect the first capacitor 24 to the second wiring 34b. In the present embodiment, the second fixing pad 86 is provided to fix the first capacitor 24 to predetermined position. Note that the second connecting pad 85 and the second fixing pad 86 may have other purposes and other functions, respectively.

The second connecting pad 85 and the second fixing pad 86 are arranged with a space in the direction along the X axis. The second connecting pad 85 includes a third edge 63. The second fixing pad 86 includes a fourth edge 64.

The second connecting pad 85 is connected to the second wiring 34b. The second connecting pad 85 and the first fixing pad 82 are adjacent to each other with a space in a direction along a Y axis.

The second fixing pad 86 is connected to the second pattern 34d. Therefore, the second fixing pad 86 is electrically separated from and independent of the circuit of the substrate 22 that includes the first and second wiring 34a and 34b. In other words, the second fixing pad 86 is not connected to the second connecting pad 85. The second fixing pad 85 and the first connecting pad 81 are adjacent to each other with a space in the direction along the Y axis.

A first terminal portion 51 extended in the direction along the X axis is arranged on the first connecting pad 81 and the first fixing pad 82. The first terminal portion 51 is soldered to the first connecting pad 81 and the first fixing pad 82. In other words, one first terminal portion 51 connected to the first connecting pad 81 and the first fixing pad 82.

A second terminal portion 52 extended in the direction along the X axis is arranged on the second connecting pad 85 and the second fixing pad 86. The second terminal portion 52 is soldered to the second connecting pad 85 and the second fixing pad 86. In other words, one second terminal portion 52 is connected to the second connecting pad 85 and the second fixing pad 86.

The first terminal portion 51 is soldered to the first connecting pad 81 and the first fixing pad 82, and the second terminal portion 52 is soldered to the second connecting pad 85 and the second fixing pad 86, so that the first capacitor 24 is mounted on a first mounting face 27. The first terminal portion 51 is connected to the first wiring 34a through the first connecting pad 81. The second terminal portion 52 is connected to the second wiring 34b through the second connecting pad 85. Therefore, the first capacitor 24 intermediate between the first wiring 34a and the second wiring 34b.

The first fixing pad 82 is independent of the circuit of the substrate 22 that includes the first and second wiring 34a and 34b. Therefore, it is suppressed that a current flows from the first terminal portion 51 to the first fixing pad 82.

The second fixing pad 86 is independent of the circuit of the substrate 22 that includes the first and second wiring 34a and 34b. Therefore, it is suppressed that a current flows from the second terminal portion 52 to the second fixing pad 86.

Figure 11:
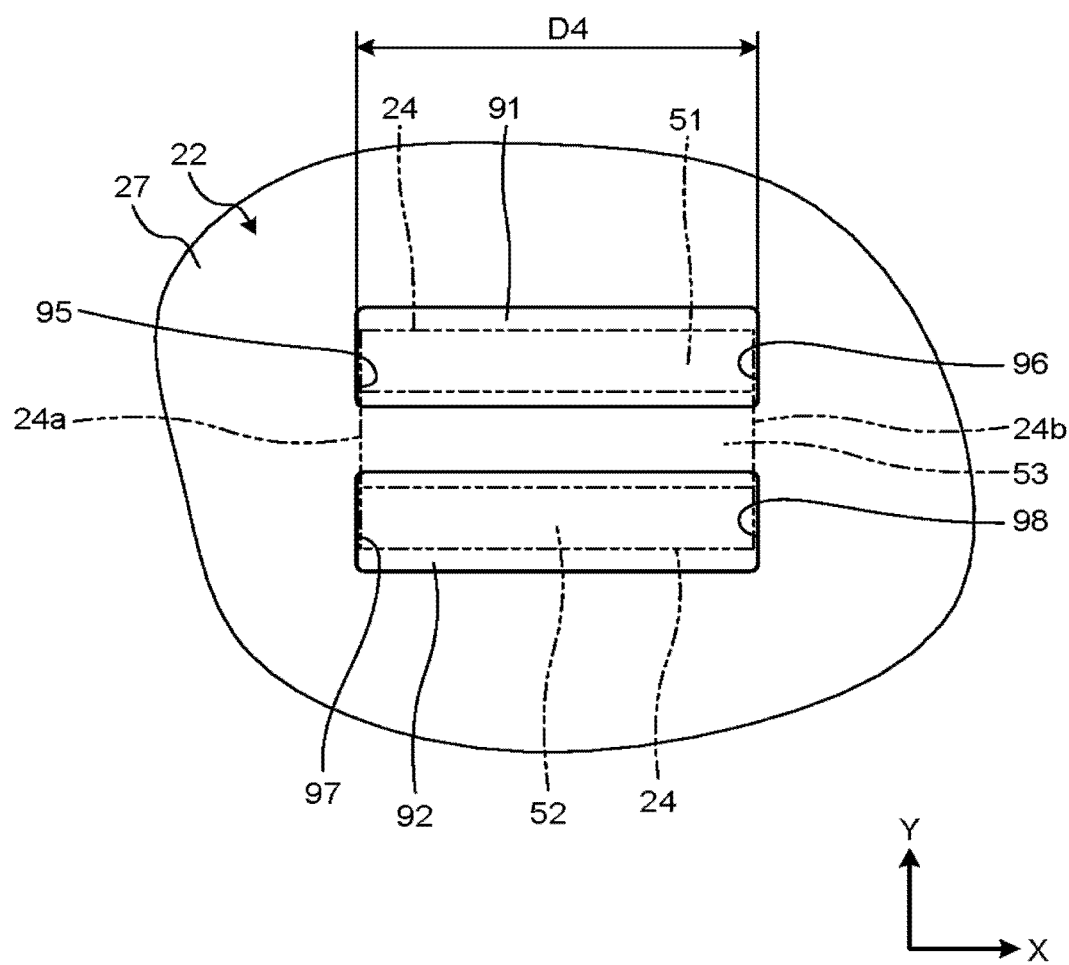
FIG. 11 is a plan view illustrating another part of the substrate and the first capacitor of the third embodiment.

FIG. 11 is a plan view illustrating another part of the substrate 22 and the first capacitor 24 of the third embodiment. As illustrated in FIG. 11, a fifth pad 91 and a sixth pad 92 are formed on the first mounting face 27 of the substrate 22. The fifth pad 91 is an example of a third conductor. The sixth pad 92 is an example of a fourth conductor. Each of the fifth and sixth pads 91 and 92 may be called a land, for example.

Each of the fifth and sixth pads 91 and 92 is extended in the direction along the X axis. In other words, the fifth and sixth pads 91 and 92 are substantially extended in parallel. The direction along the X axis is an example of a third direction. The fifth and sixth pads 91 and 92 are arranged with a space In the direction along the Y axis.

The fifth pad 91 is connected to a pattern formed of the first conductive layer 34. The fifth pad 91 may be connected to the first wiring 34a. The sixth pad 92 is connected to a pattern formed of the first conductive layer 34. The sixth pad 92 may be connected to the second wiring 34b.

Each of the fifth and sixth pads 91 and 92 is substantially formed into a quadrilateral shape. Each of the fifth and sixth pads 91 and 92 may be formed into another shape. Each of the fifth and sixth pads 91 and 92 is larger than each of the first to fourth pads 41 to 44.

The fifth pad 91 includes a fifth edge 95 and a sixth edge 96. The fifth edge 95 is an example of one edge of the third conductor. The sixth edge 96 is an example of the other edge of the third conductor.

The fifth and sixth edges 95 and 96 are both end portions of the substantially quadrilateral fifth pad 91 in the direction along the X axis. Each of the fifth and sixth edges 95 and 96 is extended in the direction along the Y axis.

The sixth pad 92 includes a seventh edge 97 and an eighth edge 98. The seventh and eighth edges 97 and 98 are both end portions of the substantially quadrilateral sixth pad 92 in the direction along the X axis. Each of the seventh and eighth edges 97 and 98 is extended in the direction along the Y axis.

A first capacitor 24 is connected to the fifth and sixth pads 91 and 92, similarly to the first and second pads 41 and 42. The first capacitor 24 of FIG. 11 is an example of a second electronic component.

The first terminal portion 51 is soldered to the fifth pad 91, and is connected to the fifth pad 91. The second terminal portion 52 is soldered to the sixth pad 92, and is connected to the sixth pad 92. Accordingly, the first capacitor 24 is connected to the fifth and sixth pads 91 and 92, and is mounted on the first mounting face 27. The first terminal portion 51 of FIG. 11 is an example of a third terminal. The second terminal portion 52 of FIG. 11 is an example of a fourth terminal.

In plan view of the first mounting face 27 illustrated in FIG. 11, each of the fifth and seventh edges 95 and 97 is slightly separated from the first capacitor 24 in the direction along the X axis. Each of the fifth and seventh edges 95 and 97 may be substantially superimposed on a first end portion 24a of the first capacitor 24 in the direction along the X axis.

In plan view of the first mounting face 27, each of the sixth and eighth edges 96 and 98 is slightly separated from the first capacitor 24 in the direction along the X axis. Each of the sixth and eighth edges 96 and 98 may be substantially superimposed on a second end portion 24b of the first capacitor 24 in the direction along the X axis.

A distance D4 between the fifth edge 95 and the sixth edge 96 is shorter than a distance D5 between the first edge 61 and the second edge 62 illustrated in FIG. 10, in the direction along the X axis. Similarly, the distance D4 between the fifth edge 95 and the sixth edge 96 is shorter than a distance between the third edge 63 and the fourth edge 64 illustrated in FIG. 10, in the direction along the X axis.

Figure 12:
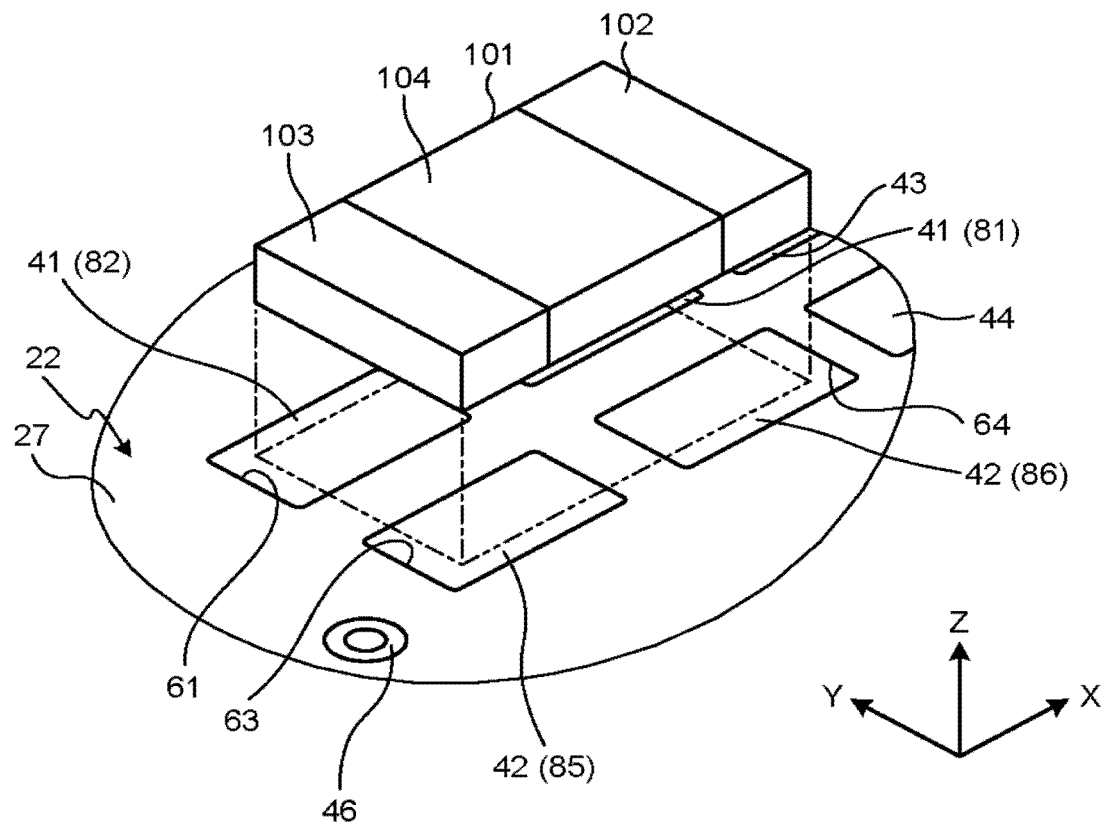
FIG. 12 is a perspective view illustrating a part of a substrate and a third capacitor of a modification of the third embodiment.
Figure 13:
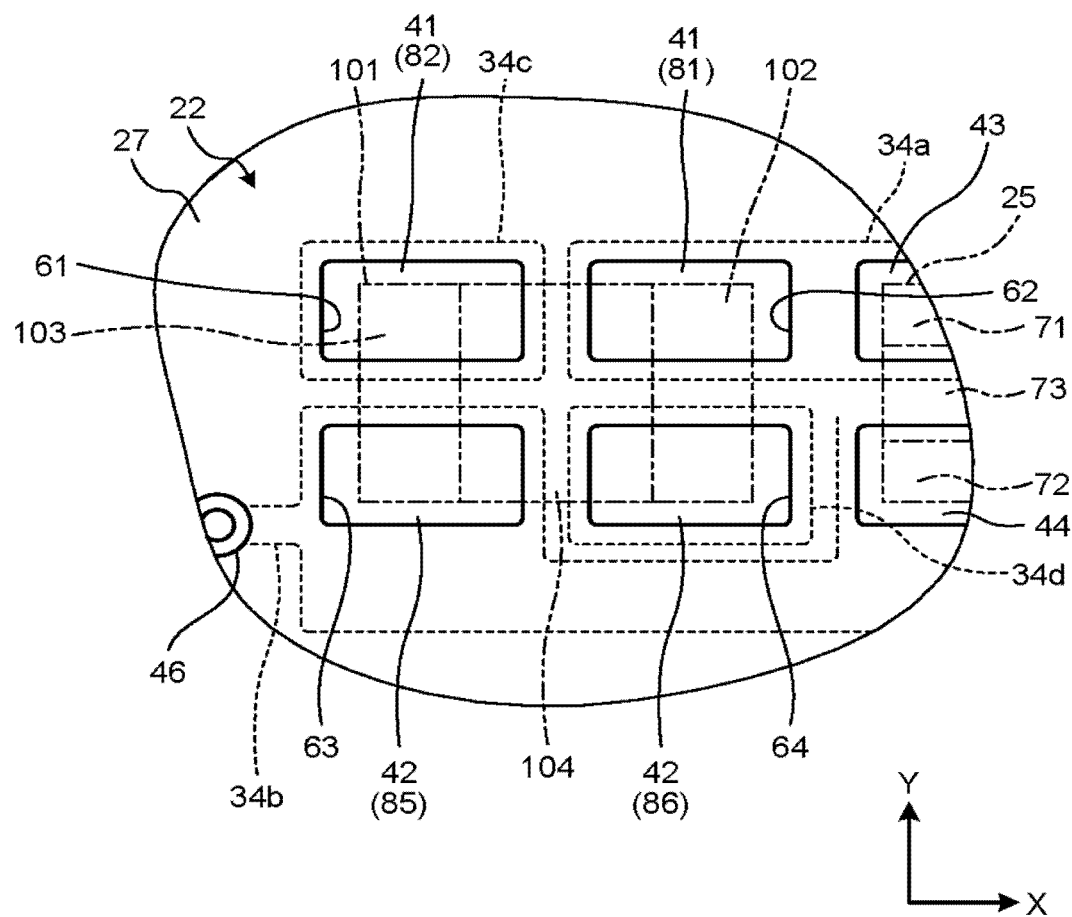
FIG. 13 is a plan view illustrating a part of the substrate and the third capacitor of the modification of the third embodiment.

FIG. 12 is a perspective view illustrating a part of a substrate 22 and a third capacitor 101 of a modification of the third embodiment. FIG. 13 is a plan view illustrating a part of the substrate 22 and the third capacitor 101 of the modification of the third embodiment. Hereinafter, the modification of an SSD 10 of the third embodiment will be described with reference to FIGS. 12 and 13. The substrate 22 of the modification is the same as the substrate 22 of the third embodiment.

As illustrated in FIG. 13, in the modification of the third embodiment, the third capacitor 101 is connected to first pads 41 and second pads 42. In other words, the third capacitor 101 is connected to the first pads 41 and the second pads 42, in place of a first capacitor 24.

The third capacitor 101 is an MLCC. Note that the third capacitor 101 may be another capacitor. The third capacitor 101 includes a fifth terminal portion 102, a sixth terminal portion 103, and an electricity storage portion 104.

The fifth terminal portion 102 is provided to one end portion of the third capacitor 101 in a direction along an X axis. The sixth terminal portion 103 is provided to the other end portion of the third capacitor 101 in the direction along the X axis. Each of the fifth and sixth terminal portions 102 and 103 is extended in a direction along a Y axis. The electricity storage portion 104 includes a plurality of internal electrodes, and a dielectric lying between the internal electrodes. The electricity storage portion 104 is positioned between the fifth terminal portion 102 and the sixth terminal portion 103.

The length (width) of the third capacitor 101 in the direction along the Y axis is shorter than the length of the third capacitor 101 in the direction along the X axis. The length of the third capacitor 101 in the direction along the X axis is substantially equal to the length (width) of the first capacitor 24 in the direction along the X axis. The length (width) of the third capacitor 101 in the direction along the Y axis is substantially equal to the length of the first capacitor 24 in the direction along the Y axis. That is, the size of the third capacitor 101 is substantially equal to the size of the first capacitor 24. Note that the size of the third capacitor 101 is not limited to the example.

The fifth terminal portion 102 extended in the direction along the Y axis is arranged on a first connecting pad 81 of the first pad 41 and a second fixing pad 86 of the second pad 42. The fifth terminal portion 102 is soldered to the first connecting pad 81 and the second fixing pad 86. In other words, one fifth terminal portion 102 is connected to the first connecting pad 81 and the second fixing pad 86.

The sixth terminal portion 103 extended in the direction along the Y axis is arranged on a first fixing pad 82 of the first pad 41 and a second connecting pad 85 of the second pad 42. The sixth terminal portion 103 is soldered to the first fixing pad 82 and the second connecting pad 85. In other words, one sixth terminal portion 103 is connected to the first fixing pad 82 and the second connecting pad 85.

As described above, the fifth terminal portion 102 is connected to the first connecting pad 81, and the sixth terminal portion 103 is connected to the second connecting pad 85. Accordingly, the third capacitor 101 connects first wiring 34a and second wiring 34b.

An ESL of the first capacitor 24 is lower than that of the third capacitor 101. Therefore, a sum of the ESLs of the first capacitor 24 and the plurality of second capacitors 25 of the third embodiment is lower than a sum of ESLs of the third capacitor 101 and a plurality of second capacitors 25 of the modification of the third embodiment.

Capacitance of the first capacitor 24 is larger than that of the third capacitor 101. Therefore, a sum of capacitance of the first capacitor 24 and the plurality of second capacitors 25 of the third embodiment is larger than a sum of capacitance of the third capacitor 101 and the plurality of second capacitors 25 of the modification of the third embodiment.

As described in the third embodiment and the modification of the third embodiment, the first capacitor 24 or the third capacitor 101 can be selectively connected to the first pads 41 and the second pads 42.

In the above description, the pairs of the first pads 41 and the second pads 42 are provided on the substrate 22. However, a plurality of sets of the first pads 41 and the second pads 42 may be provided on the substrate 22. In this case, the first capacitor 24 is connected to at least one set of the first pads 41 and the second pads 42, and the third capacitor or third capacitors 101 may be connected to the remaining sets of the first pads 41 and the second pads 42.

In the SSD 10 of the third embodiment, the first pads 41 are arranged in the direction along the X axis, and includes the first connecting pad 81 connected to the first wiring 34a, and the first fixing pad 82 independent of the first and second wiring 34a and 34b. The second pad 42 is arranged in the direction along the X axis, and includes the second connecting pad 85 connected to the second wiring 34b and adjacent to the first fixing pad 82 in the direction along the Y axis, and the second fixing pad 86 independent of the first and second wiring 34a and 34b and adjacent to the first connecting pad 81 in the direction along the Y axis. Accordingly, the first capacitor 24 in which the first terminal portion 51 is soldered to the first connecting pad 81 and the first fixing pad 82, and the second terminal portion 52 is soldered to the second connecting pad and the second fixing pad can be changed to the third capacitor 101 in which the fifth terminal portion 102 is soldered to the first connecting pad 81 and the second fixing pad 86, and the sixth terminal portion 103 is soldered to the second connecting pad 85 and the first fixing pad 82, without design change of the substrate 22.

The distance D5 between the first edge 61 and the second edge 62 in the direction along the X axis is longer than the distance D4 between the fifth edge 95 and the sixth edge 96 of the fifth pad 91 in the direction along the X axis. Accordingly, the first and second pads 41 and 42 can be formed larger than a case where the distance D5 between the first edge 61 and the second edge 62 is equal to the distance D4 between the fifth edge 95 and the sixth edge 96 of the fifth pad 91. Therefore, the amount of soldering in a connection portion between the first and second pads 41 and 42, and the first and second terminal portions 51 and 52 becomes larger, and the first capacitor 24 can be more firmly fixed to the first and second pad 41 and 42.

(Fourth Embodiment)

Figure 14:
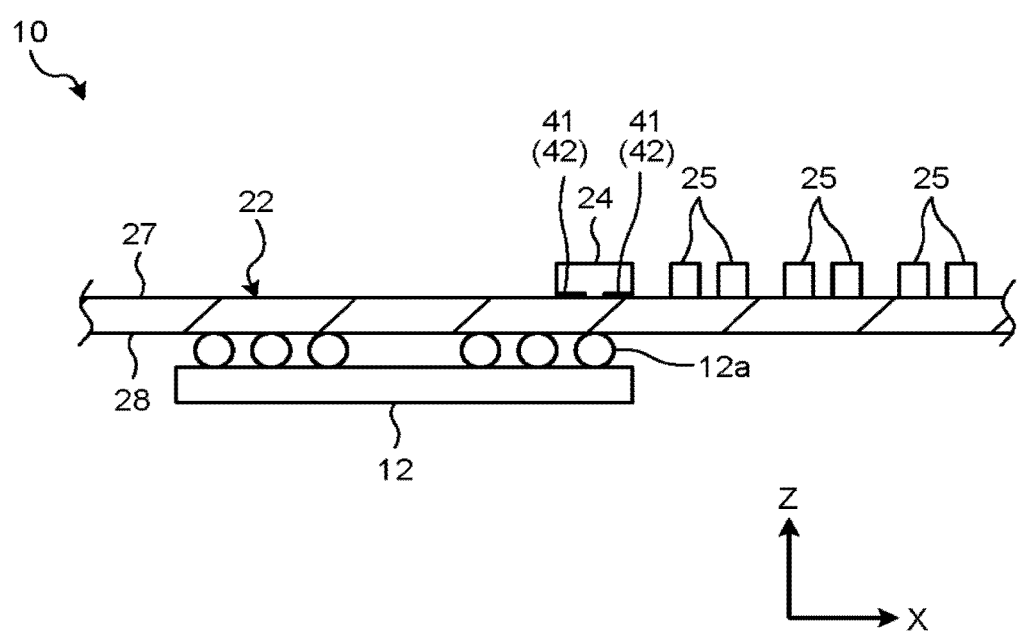
FIG. 14 is a sectional view illustrating a part of an inside of an SSD according to a fourth embodiment.

Hereinafter, a fourth embodiment will be described with reference to FIG. 14. FIG. 14 is a sectional view illustrating a part of an inside of an SSD 10 according to the fourth embodiment. As illustrated in FIG. 14, a controller 12 of the fourth embodiment is mounted to a second mounting face 28.

Portions of the SSD 10 excluding the controller 12 are the same as one of the first to third embodiments. A first capacitor 24 and second capacitors 25 are mounted on the first mounting face 27 similarly to one of the first to third embodiments. In other words, first to fourth pads 41 to 44 are provided on the first mounting face 27.

The first pads 41 are superimposed on the controller 12 in a thickness direction (direction along a Z axis) of the substrate 22. In other words, the first pads 41 are superimposed on the controller 12 in plan view of the first mounting face 27 (in plan view in the direction along the Z axis).

The second pads 42 are superimposed on the controller 12 in the thickness direction of the substrate (the direction along the Z axis). In other words, the second pads 42 are superimposed on the controller 12 in plan view of the first mounting face 27.

The first capacitor 24 is superimposed on the controller 12 in the thickness direction of the substrate 22. The plurality of second capacitors 25 is positioned outside the controller 12 in the thickness direction of the substrate 22. Note that at least one of the second capacitors 25 may be superimposed on the controller 12 in the thickness direction of the substrate 22.

In the SSD 10 of the fourth embodiment, the first and second pads 41 and 42 are superimposed on the controller 12 in the thickness direction of the substrate 22. Accordingly, a noise of the controller 12 passes through the first capacitor 24 and escapes to a ground layer 31 in a shorter path, and it is suppressed that the first wiring 34*a* functions as an inductor. Therefore, the first capacitor 24 can more efficiently decrease variation of a power supply voltage.

According to at least one embodiment described above, the first terminal of the first electronic component is connected to the plurality of first conductors, and the second terminal is connected to the plurality of second conductors. Accordingly, change of the characteristics of the electronic device can become easier.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a substrate including a first face;
   a plurality of first conductors on the first face;
   a plurality of second conductors on the first face;
   a first electronic component mounted on the first face, and including a first terminal connected to two or more of the first conductors, and a second terminal connected to two or more of the second conductors;
   a first conductive portion in the substrate; and
   a second conductive portion in the substrate, wherein
   two or more of the first conductors are arranged in a first direction along the first face, and include a first connecting conductor connected to the first conductive portion, and include a first fixing conductor electrically separated from the first conductive portion and the second conductive portion,
   two or more of the second conductors are arranged in the first direction, and include a second connecting conductor connected to the second conductive portion and adjacent to the first fixing conductor in a second direction along the first face and intersecting with the first direction, and include a second fixing conductor electrically separated from the first conductive portion and the second conductive portion and adjacent to the first connecting conductor in the second direction,
   the first terminal is connected to the first connecting conductor and the first fixing conductor via a soldering, and
   the second terminal is connected to the second connecting conductor and the second fixing conductor via a soldering.

2. The electronic device according to claim 1, wherein the first electronic component includes a stacked ceramic capacitor including the first terminal and the second terminal.

3. The electronic device according to claim 1, wherein the plurality of first conductors are arranged in the first direction,
   the plurality of second conductors are arranged in the first direction,
   the first terminal is extended in the first direction, and the second terminal is extended in the first direction.

4. The electronic device according to claim 3, wherein a length of the first electronic component in the first direction is longer than a length of the first electronic component in the second direction intersecting with the first direction.

5. The electronic device according to claim 3, wherein the plurality of first conductors include a first end conductor adjacent to only one of the plurality of first conductors in the first direction, and a second end conductor adjacent to only one of the plurality of first conductors in the first direction,
   the first electronic component includes a first end portion and a second end portion in the first direction,
   the first end conductor includes a first edge superimposed on the first end portion or separated from the first electronic component, in the first direction, in plan view of the first face,
   the second end conductor includes a second edge superimposed on the second end portion or separated from the first electronic component, in the first direction, in plan view of the first face, the plurality of second conductors include a third end conductor adjacent to only one of the plurality of second conductors in the first direction, and a fourth end conductor adjacent to only one of the plurality of second conductors in the first direction, the third end conductor includes a third edge superimposed on the first end portion or separated from the first electronic component, in the first direction, in plan view of the first face, and the fourth end conductor includes a fourth edge superimposed on the second end portion or separated from the first electronic component, in the first direction, in plan view of the first face.

6. The electronic device according to claim 5, further comprising:
a third conductor on the substrate and extended in a third direction;
a fourth conductor on the substrate and extended in the third direction; and
a second electronic component that is the same as the first electronic component, and including a third terminal connected to the third conductor, and a fourth terminal connected to the fourth conductor, wherein
a distance between the first edge and the second edge in the first direction is longer than a distance between one edge and the other edge of the third conductor in the third direction.

7. The electronic device according to claim 3, further comprising:
a fifth conductor on the first face, and adjacent to the plurality of first conductors in the first direction;
a sixth conductor on the first face, adjacent to the plurality of second conductors in the first direction, and adjacent to the fifth conductor in a second direction intersecting with the first direction; and
a third electronic component mounted on the first face, and including a fifth terminal connected to the fifth conductor, and a sixth terminal connected to the sixth conductor, wherein
a distance between the plurality of first conductors and the fifth conductor in the first direction is shorter than a distance between the adjacent first conductors in the first direction.

8. The electronic device according to claim 3, further comprising:
a fifth conductor on the first face, and adjacent to the plurality of first conductors in the first direction;
a sixth conductor on the first face, adjacent to the plurality of second conductors in the first direction, and adjacent to the fifth conductor in a second direction intersecting with the first direction; and
a third electronic component mounted on the first face, and including a fifth terminal connected to the fifth conductor and a sixth terminal connected to the sixth conductor, wherein
a distance between the plurality of first conductors and the fifth conductor in the first direction is longer than a distance between the adjacent first conductors in the first direction.

9. The electronic device according to claim 1, further comprising:
a fourth electronic component mounted on the first face, and including a power supply terminal;
a ground layer in the substrate;
a first conductive portion in the substrate;
a second conductive portion in the substrate;
a seventh conductor the first face, and adjacent to the plurality of first conductors in a first direction;
an eighth conductor on the first face, adjacent to the plurality of second conductors in the first direction, and adjacent to the seventh conductor in a second direction intersecting with the first direction; and
a fifth electronic component mounted on the first face, and including a seventh terminal connected to the seventh conductor and an eighth terminal connected to the eighth conductor, wherein
the first conductive portion connects the plurality of first conductors and the seventh conductor, and the power supply terminal,
the second conductive portion connects the plurality of second conductors and the eighth conductor, and the ground layer,
the plurality of first conductors are arranged in the first direction, and are closer to the power supply terminal than the seventh conductor, and
the plurality of second conductors are arranged in the first direction, and are closer to the power supply terminal than the eighth conductor.

10. The electronic device according to claim 1, further comprising:
a fourth electronic component mounted on the substrate, and including a power supply terminal;
a ground layer in the substrate;
a first conductive portion in the substrate, and connected to the plurality of first conductors; and
a second conductive portion in the substrate, and connected to the plurality of second conductors, wherein
the first conductive portion connects the plurality of first conductors and the power supply terminal,
the second conductive portion connects the plurality of second conductors and the ground layer,
the substrate includes a second face positioned on an opposite side to the first face, and on which the fourth electronic component is mounted,
at least one of the first conductors is superimposed on the fourth electronic component in a thickness direction of the substrate, and
at least one of the second conductors is superimposed on the fourth electronic component in the thickness direction of the substrate.

11. The electronic device according to claim 1, further comprising:
a plurality of fifth conductors on the first face;
a plurality of sixth conductors on the first face; and
a plurality of third electronic components mounted on the first face, wherein
the plurality of first conductors are arranged in a first direction,
the plurality of fifth conductors are arranged in a first direction, and adjacent to the plurality of first conductors in the first direction,
the plurality of second conductors are arranged in a first direction, and adjacent to the plurality of first conductors in a second direction intersecting with the first direction,
the plurality of sixth conductors are arranged in a first direction, adjacent to the plurality of second conductors in the first direction, and adjacent to the plurality of fifth conductors in the second direction,
each of the third electronic components includes a fifth terminal connected to one of the fifth conductors, and a sixth terminal connected to one of the sixth conductors, distances between the adjacent fifth conductors are substantialy equal to one another in the first direction.

12. A substrate comprising:
a first face;
   a plurality of first conductors on the first face configured to be connected by a first terminal of a first electronic component configured to be mounted on the first face;
   a plurality of second conductors on the first face configured to be connected by a second terminal of the first electronic component;
   a first conductive portion; and
   a second conductive portion, wherein
   the plurality of first conductors are arranged in a first direction along the first face, and include a first connecting conductor connected to the first conductive portion, and a first fixing conductor independent of the first conductive portion and the second conductive portion, and
   the plurality of second conductors are arranged in the first direction, and include a second connecting conductor connected to the second conductive portion and adjacent to the first fixing conductor in a second direction along the first face and intersecting with the first direction, and a second fixing conductor independent of the first conductive portion and the second conductive portion and adjacent to the first connecting conductor in the second direction.

13. The substrate according to claim 12, wherein
the plurality of first conductors are arranged in the first direction, and
the plurality of second conductors are arranged in the first direction.

14. The substrate according to claim 13, further comprising:
   a ninth conductor on the first face, adjacent to the plurality of first conductors in the first direction, and configured to be connected to a ninth terminal of a sixth electronic component configured to be mounted on the first face; and
   a tenth conductor on the first face, adjacent to the plurality of second conductors in the first direction, adjacent to the ninth conductor in a second direction intersecting with the first direction, and configured to be connected to a tenth terminal of the sixth electronic component, wherein
   a distance between the plurality of first conductors and the ninth conductor in the first direction is shorter than a distance between the adjacent first conductors in the first direction.

15. The substrate according to claim 13, further comprising:
   a ninth conductor on the first face, adjacent to the plurality of first conductors in the first direction, and configured to be connected to a ninth terminal of a sixth electronic component configured to be mounted on the first face; and
   a tenth conductor on the first face, adjacent to the plurality of second conductors in the first direction, adjacent to the ninth conductor in a second direction intersecting with the first direction, and configured to be connected to a tenth terminal of the sixth electronic component, wherein
   a distance between the plurality of first conductors and the ninth conductor in the first direction is longer than a distance between the adjacent first conductors in the first direction.

\* \* \* \* \*